(12) United States Patent
Wu et al.

(10) Patent No.: US 12,398,615 B2
(45) Date of Patent: Aug. 26, 2025

(54) CHARACTERIZATION AND DIAGNOSIS OF SOLENOIDS USED IN WELL EQUIPMENT

(71) Applicant: Halliburton Energy Services, Inc., Houston, TX (US)

(72) Inventors: Junchao Wu, Houston, TX (US); Imran Sharif Vehra, Houston, TX (US); Shi Jing Jackie Yeo, Singapore (SG)

(73) Assignee: Halliburton Energy Services, Inc., Houston, TX (US)

( * ) Notice: Subject to any disclaimer, the term of this patent is extended or adjusted under 35 U.S.C. 154(b) by 228 days.

(21) Appl. No.: 18/305,242

(22) Filed: Apr. 21, 2023

(65) Prior Publication Data
US 2024/0352826 A1    Oct. 24, 2024

(51) Int. Cl.
*E21B 34/06* (2006.01)
*E21B 47/07* (2012.01)

(52) U.S. Cl.
CPC ............ *E21B 34/066* (2013.01); *E21B 47/07* (2020.05)

(58) Field of Classification Search
CPC .............................. E21B 34/066; E21B 47/07
See application file for complete search history.

(56) References Cited

U.S. PATENT DOCUMENTS

| | | | |
|---|---|---|---|
| 5,808,471 A | 9/1998 | Rooke et al. | |
| 7,357,019 B2 | 4/2008 | McDonald et al. | |
| 7,432,721 B2 | 10/2008 | Rober | |
| 9,664,241 B2 | 5/2017 | Wakao | |
| 2006/0021345 A1* | 2/2006 | McDonald | F02D 23/00 60/602 |
| 2013/0054034 A1 | 2/2013 | Ebenezer | |
| 2024/0018846 A1* | 1/2024 | Geiger | E21B 34/066 |

FOREIGN PATENT DOCUMENTS

| | | |
|---|---|---|
| AU | 2009245861 | 8/2015 |
| EP | 4151892 | 3/2023 |
| JP | 2003166668 | 6/2003 |

OTHER PUBLICATIONS

"PCT Application No. PCT/US2023/066145, International Search Report and Written Opinion", Jan. 16, 2024, 9 pages.

\* cited by examiner

*Primary Examiner* — Scott Bauer
(74) *Attorney, Agent, or Firm* — DeLizio, Peacock, Lewin & Guerra LLP

(57) ABSTRACT

Systems, methods, and apparatus, including computer programs encoded on computer-readable media, for determining an operational state of one or more solenoids of well equipment are disclosed. A characterization and diagnosis apparatus can determine characterization measurements for a solenoid. The characterization measurements can be obtained during a characterization mode of the solenoid based on drive voltages and temperatures. The characterization and diagnosis apparatus can determine sampled measurements for the solenoid during an operational diagnosis mode of the well equipment. The characterization and diagnosis apparatus can compare the characterization measurements to the sampled measurements to diagnose the operational state of the solenoid.

20 Claims, 12 Drawing Sheets

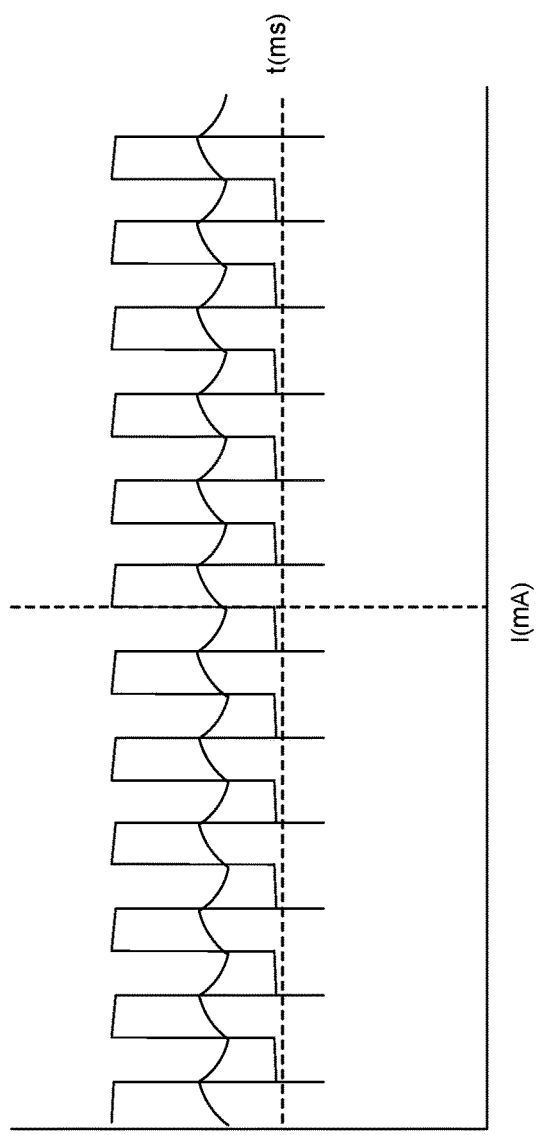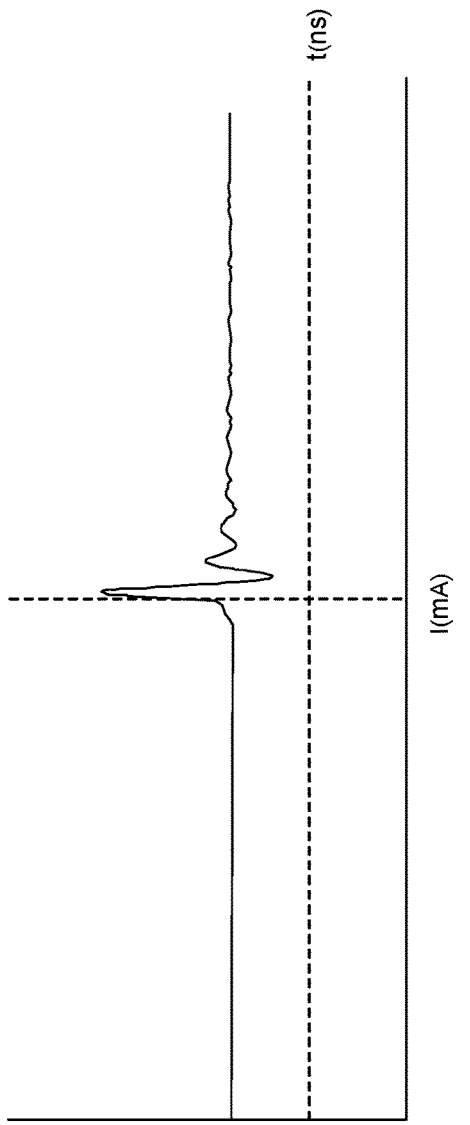

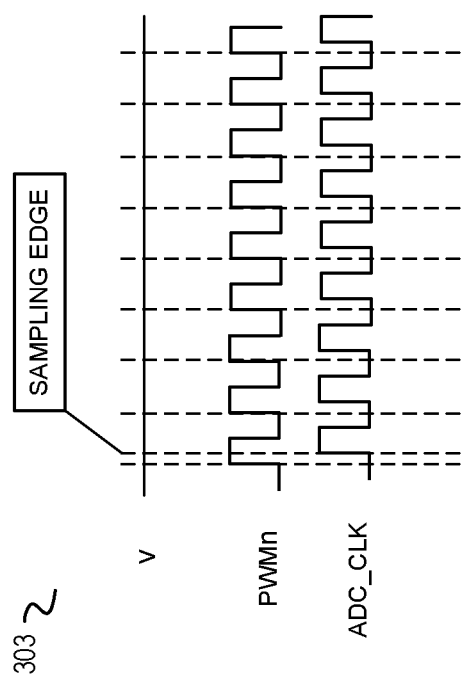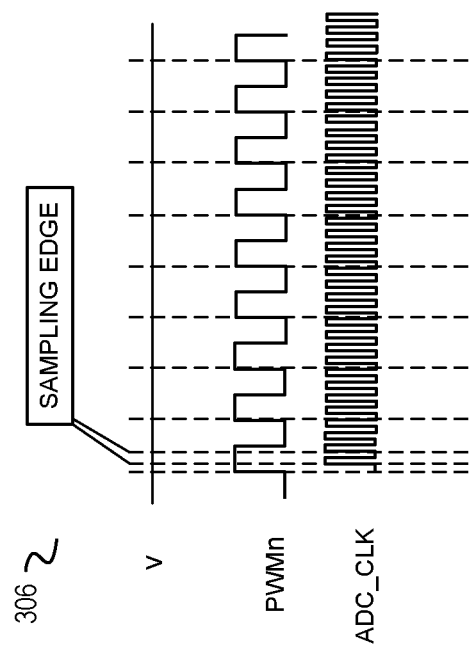

CHARACTERIZATION AND DIAGNOSIS OF SOLENOIDS USED IN WELL EQUIPMENT

TECHNICAL FIELD

The present invention relates generally to energy services, and more specifically to characterization and diagnosis of solenoids used in well equipment.

BACKGROUND

Reliable solenoid detection can be important for the operation of various types of well equipment, such as well equipment used in the oil and gas services industry. Traditional solenoid analysis techniques are typically inaccurate and can result in well operators using faulty solenoids, such as sending faulty solenoids downhole that cause field failures and non-productive time. Incorporating sensors or other complex feedback mechanisms for solenoid detection can increase the cost of the well equipment and adds complexity that will lower the reliability of the well equipment and overall system.

BRIEF DESCRIPTION OF THE DRAWINGS

FIG. 2A is an example of a pulse width modulator (PWM) signal and a current profile with switching noise.

FIG. 2B is an example of a close-up of the switching noise with overshoot.

FIG. 3A is an example of a delay between the PWM signal and an analog-to-digital converter (ADC) clock signal for avoiding the switching noise.

FIG. 3B is an example of a synchronized sampling technique.

DESCRIPTION

Figure 1:
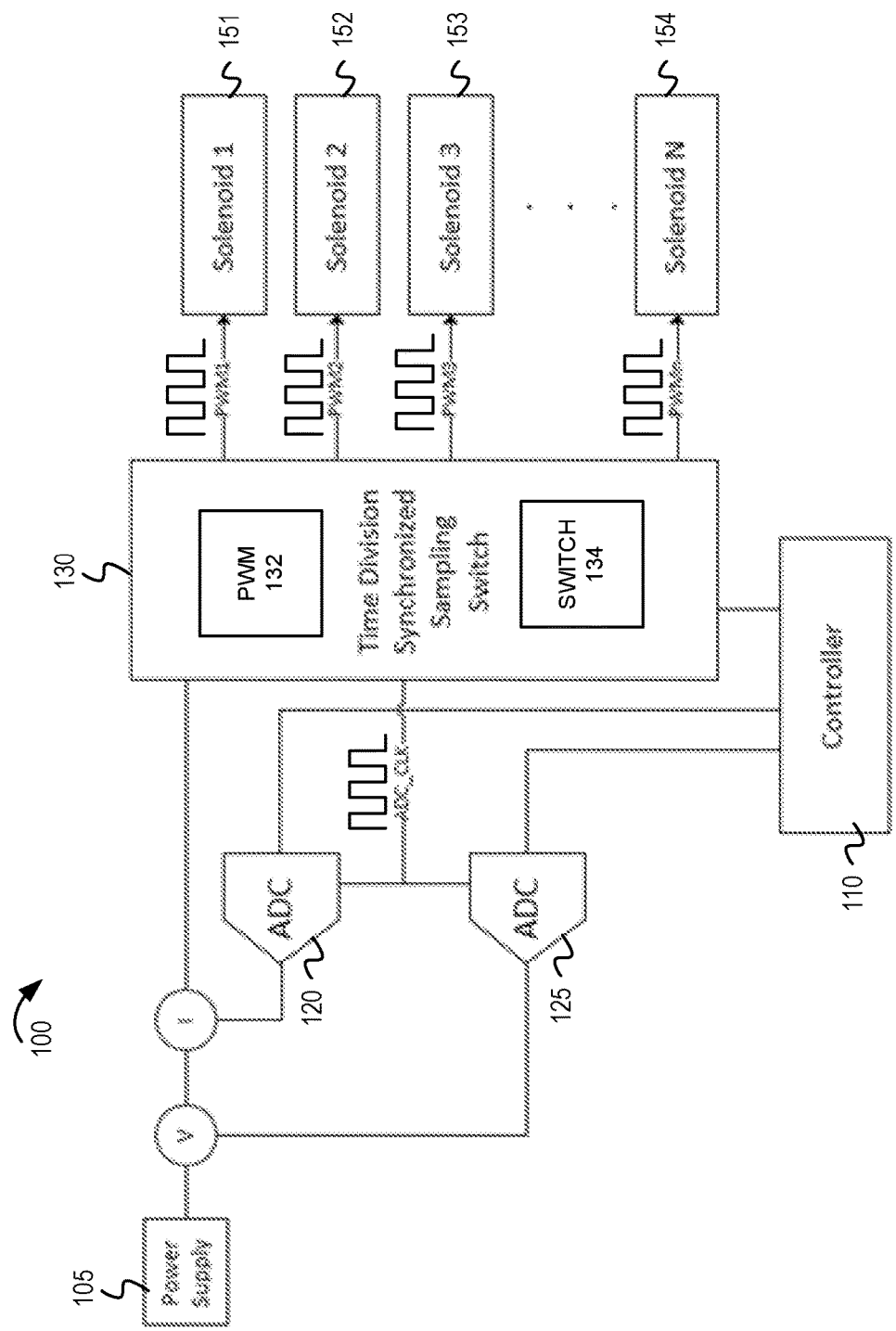
FIG. 1 depicts an example apparatus and system for characterizing and diagnosing one or more solenoids that are used in well equipment.

The description that follows includes example systems, methods, techniques, and program flows that describe aspects of the disclosure. However, it is understood that this disclosure may be practiced without these specific details. For instance, this disclosure refers to reservoir modeling in illustrative examples. Aspects of this disclosure can be instead applied to other types of models involving spatiotemporal datasets. In other instances, well-known instruction instances, protocols, structures, and techniques have not been shown in detail to avoid confusion.

Reliable solenoid detection is important for the operation of various types of well equipment, such as well equipment used in the oil and gas services industry or the hydrocarbon services industry. For example, reliable solenoid movement and position feedback is important for various downhole tools, such as formation testers, fluid sampling, or similar tools where one or more solenoids control the opening and closing of valves. Traditional solenoid analysis techniques that use coarse current and voltage measurements are typically inaccurate, provide noise-induced results, do not consider environmental factors (such as temperature), and do not provide a direct indication of solenoid position or movement. Traditional solenoid analysis techniques typically result in well operators using faulty solenoids, such as sending faulty solenoids downhole that cause field failures and non-productive time. Incorporating complex feedback mechanisms (such as using sensors) for solenoid detection increases the cost of the well equipment and adds complexity that will lower the reliability of the well equipment and overall system.

Various innovative aspects of the subject matter described in this disclosure for solenoid characterization and diagnosis can be implemented in well equipment that uses one or more solenoids for various operations in the oil and gas services industry. For example, well equipment may include surface and downhole equipment and tools and various other equipment used in the oil and gas services industry, such as well equipment to prepare and test well sites and well drilling equipment to extract hydrocarbons. In some implementations, a solenoid characterization and diagnosis system, apparatus, and method may be implemented for a well equipment that uses one or more solenoids. In some implementations, the solenoid characterization and diagnosis techniques may use high-speed sampling of solenoid drive current and voltage to detect solenoid position and movement in a sensor-less fashion. Characterization and diagnosis of one or more solenoids without the use of sensors can reduce the complexity and cost of the system. In some implementations, the solenoid characterization and diagnosis techniques may perform synchronized sampling to reduce the potential noise interference on current and voltage samplings for both characterization and downhole operations. In some implementations, the solenoid characterization and diagnosis techniques may consider different environmental scenarios, such as temperature, for characterizing the solenoids. Furthermore, in some implementations, a time-division scheme may be used to utilize common hardware to characterize, detect and diagnose multiple solenoids in a timely manner.

In some implementations, the solenoid characterization and diagnosis techniques may characterize, diagnose and detect the status or state of multiple solenoids without the use of sensors. The solenoid characterization and diagnosis techniques may accurately and timely characterize, diagnose and detect downhole solenoids. The accurate and timely characterization, diagnosis and detection of solenoids may increase the manufacturing test and assembly efficiency, reduce the repair and maintenance labor and time (which reduces the cost to resolve a detected failure), and increase the overall operational efficiency, since a solenoid issue can be timely detected and diagnosed, and the solenoid issue can be quickly reported to the surface operator. Furthermore, from an equipment and tool design and cost perspective, having sensor-less feedback mechanisms can reduce the system cost and lower the system complexity, which can also increase the system reliability. Thus, the solenoid characterization and diagnosis techniques may reduce the total ownership cost and capital expenditures, and at the same time, accurately characterize, diagnose and detect one or more solenoid used in well equipment without complicated detection feedback mechanisms.

FIG. 1 depicts an example apparatus and system for characterizing and diagnosing one or more solenoids that are used in well equipment. The system 100 (which may be referred to as a solenoid characterization and diagnosis system or apparatus) may include a power supply 105, a controller 110, a first analog-to-digital converter (ADC) 120, a second ADC 125, a time-division synchronized sampling switch 130, and one or more solenoids, such as solenoids 151-154. In some implementations, the system 100 may be implemented in surface or downhole well equipment for the characterization and diagnosis of one or more solenoids that are located at the surface, downhole, or both.

In some implementations, the power supply 105 may provide power to the system 100 including the time-division synchronized sampling switch 130. The time-division synchronized sampling switch 130 may include a pulse-width modulator (PWM) 132 and a switch 134. The PWM 132 may provide a drive voltage (such as from the voltage provided by the power supply 105) to one or more of the solenoids 151-154 that is controlled by the duty cycle of a PWM signal generated by the PWM 132. For example, if the power supply 105 is a 5V power supply, a PWM signal with a 20% duty cycle may provide a drive voltage of 1 volt to one or more of the solenoids 151-154, and a PWM signal with a 60% duty cycle may provide a drive voltage of 3 volts to one or more of the solenoids 151-154. The switch 134 can select whether the PWM signal is provided to a single solenoid (such as solenoid 151) or to two or more solenoids (such as solenoid 151 and solenoid 153). In some implementations, in addition to generating the PWM signal, the PWM 132 also may generate an ADC clock signal and provide the ADC clock signal to the ADCs 120 and 125. The PWM signal and the ADC clock signal are used to synchronize the sampling of the solenoid current and voltage by the ADCs 120 and 125, such as to sample a peak current and a valley current for a particular drive current and temperature, as further described below. In some implementations, the solenoids 151-154 can be characterized and diagnosed without adding feedback sensors, and with precise, noise-free current and voltage measurements by performing synchronized sampling of the drive voltage and current of the solenoids 151-154 in both downhole and surface tests using the PWM signal and the ADC clock signal.

Sampling solenoid current and voltage at the edge of the PWM signal is not desired as the measurement signal can be contaminated by switching noise from the high power of the PWM signal. An example of a PWM signal and a current profile with switching noise 202 is shown in FIG. 2A and a close-up of the switching noise with overshoot 204 is shown in FIG. 2B. The current profile with switching noise can cause inaccurate measurement and inaccurate solenoids detection and diagnosis.

In some implementations, the system 100 implements a synchronized sampling technique that samples the solenoid current and voltage in a digital manner that avoids the switching noise issue. In the synchronized sampling technique shown in FIG. 3A, the ADCs 120 and 125 of the system 100 may use the ADC clock signal (ADC_CLK) that is synchronized with the PWM signal for current and voltage sampling. Also, as shown in 303 of FIG. 3A, there is a delay between the PWM signal and the ADC clock signal to avoid the switching noise. In the synchronized sampling technique shown in 306 of FIG. 3B, the ADC clock signal may be of higher frequency than the PWM signal so that more samples can be captured, which increases the accuracy of current and voltage measurement. In both the synchronized sampling techniques of FIGS. 3A and 3B, the system 100 avoids sampling near or at the edge of the PWM signal due to the high power or the higher frequency of the PWM signal. The sampled measurements may then be provided to the controller 110 for further analysis and recordation.

Returning to FIG. 1, in some implementations, the ADC 120 is used to sample a current associated with a solenoid (such as the solenoid 151), and the ADC 125 is used to sample the voltage of the power supply 105. The purpose of measuring the voltage is to track its variation. If the sampled voltage differs greatly from the intended supplied voltage, the difference may indicate a faulty solenoid.

For current sampling of multiple solenoids (such as solenoids 151-154), the system 100 may implement time-division synchronized sampling. Time-division synchronized sampling may involve a common ADC (such as ADC 120) that samples current for all of the solenoids 151-154 periodically at different times, as shown in FIG. 1. For example, the synchronized sampling may be divided into N time period that correspond to the N solenoids. In the example shown in FIG. 1, the synchronized sampling may be divided into four time periods for the four solenoids 151-154. At a first time period, the ADC 120 may sample current for the solenoid 151. At a second time period, the ADC 120 may sample current for the solenoid 152. At a third time period, the ADC 120 may sample current for the solenoid 153. At a fourth time period, the ADC 120 may sample current for the solenoid 154. Utilizing a common ADC for sampling current reduces the number of ADCs of the system, and hence reduces the complexity and real estate of the printed circuit boards (PCBs).

Figure 4:
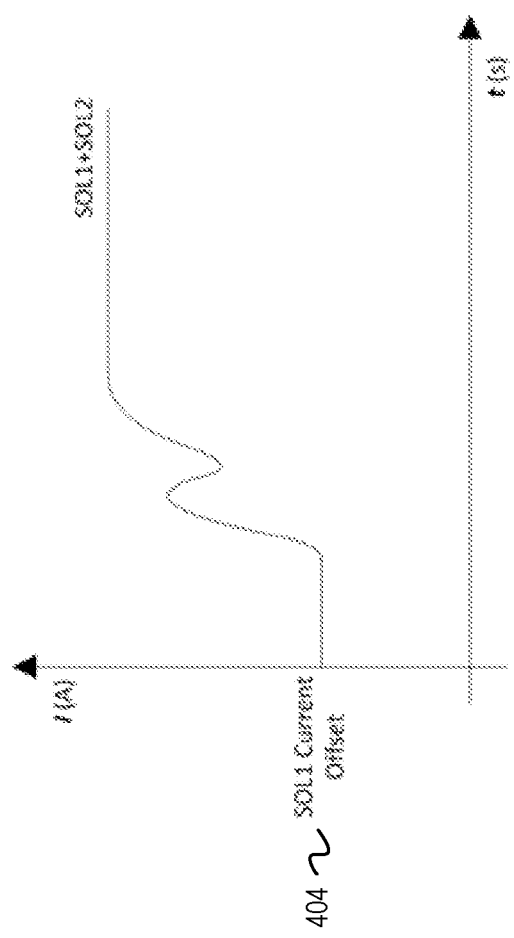
FIG. 4 is an example of offsetting a steady-state current of a first solenoid to obtain the current profile of a second solenoid.
Figure 5A:
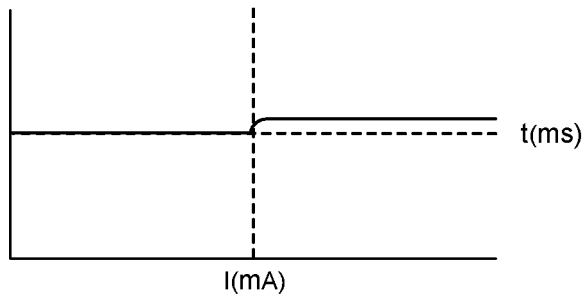
FIGS. 5A-5F are examples of different levels of driving voltages that may be used to characterize solenoids during a characterization mode.
Figure 5B:
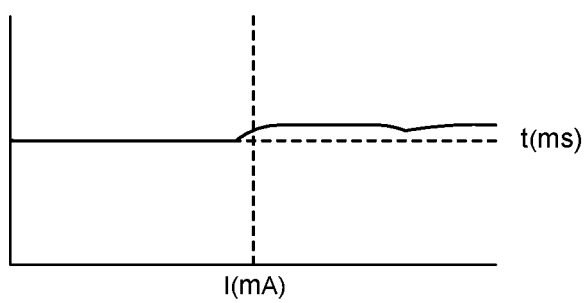
Figure 5C:
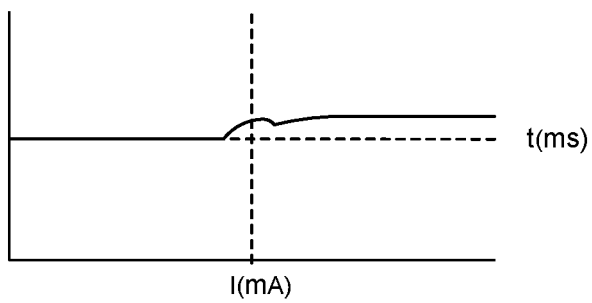
Figure 5D:
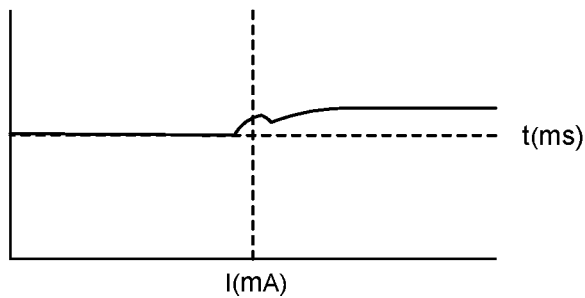
Figure 5E:
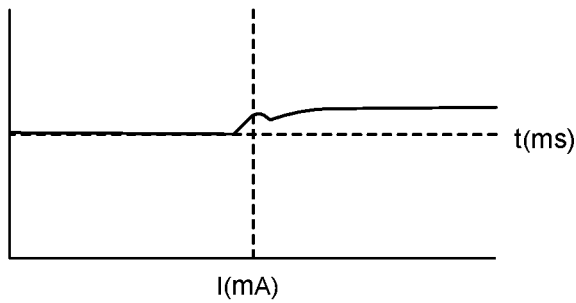
Figure 5F:
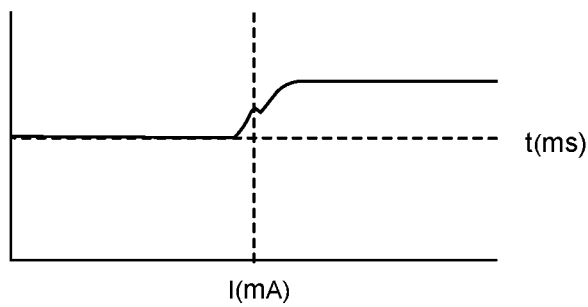

In some implementations, a single solenoid may be operated (turned ON/OFF) during each time period for the time-division synchronized sampling to reduce the complexity and uncertainty. In some implementations, two or more solenoids may be operated at the same time. A first solenoid (SOL1, such as solenoid 151) may be switched on initially and the current profile is sampled for the first solenoid. To determine the current profile of a second solenoid (SOL2, such as solenoid 152), the second solenoid is switched on, the current is sampled, and the measured signal can be digitally processed by offsetting the steady-state current of the first solenoid that remains in an active state. In this case, the steady-state current of the first solenoid will be offset from the current sampled by the ADC 120 to get the current profile of the second solenoid, as shown in 404 of FIG. 4.

According to the typical current profile of solenoids, the time duration to reach the current peak and current valley will vary, which can make it difficult to adapt the diagnosis to different solenoids and different solenoids driving conditions. As shown in FIGS. 5A-5F, in some implementations, different levels of driving voltages may be used to characterize solenoids (such as solenoids 151-154) during a characterization mode, prior to operating the well equipment (and the corresponding solenoids) during an operational diagnosis mode. For example, in 501 of FIG. 5A, the drive voltage can be provided to the solenoid using the PWM signal with a 20% duty cycle generated from the power supply during the characterization mode and the characterization measurements are recorded. In one example, the power supply can be a 24V power supply. However, in other examples, the power supply can be various types of power supplies that provide various different amounts of power and voltage. In 502 of FIG. 5B, the drive voltage can be provided to the solenoid using the PWM signal with a 25% duty cycle generated from the power supply and the characterization measurements can be recorded. In 503 of FIG. 5C, the drive voltage can be provided to the solenoid using the PWM signal with a 33% duty cycle generated from the power supply and the characterization measurements can be recorded. In 504 of FIG. 5D, the drive voltage can be provided to the solenoid using the PWM signal with a 42% duty cycle generated from the power supply and the characterization measurements can be recorded. In 505 of FIG. 5E, the drive voltage can be provided to the solenoid using the PWM signal with a 50% duty cycle generated from the power supply and the characterization measurements can be recorded. In 506 of FIG. 5E, the drive voltage can be provided to the solenoid using the PWM signal with a 83% duty cycle generated from the power supply and the characterization measurements can be recorded. As further described below, the characterization measurement can be determined and recorded for the different duty cycles at various different temperatures during the characterization mode. For example, the various characterization measurements can be recorded in a look-up table.

The operations diagnosis mode may be a downhole diagnosis mode when solenoids of the well equipment are operated downhole for diagnosis purposes. The basic solenoid characteristics can be evaluated during the characterization mode by taking and storing characterization measurements, and the stored characterization measurements (which also may be referred to as characterization parameters) can be used during the operational mode diagnosis, such as the downhole diagnosis mode, to determine whether the solenoids are working properly or are faulty. In some implementations, from characterization mode, the correlation between the PWM signal (having a certain duty cycle) and the time interval to reach peak current and valley current can be obtained. Also, the minimum PWM duty cycle to turn on and hold the solenoids status will be captured by the characterization process, which will contribute to the power and energy saving for the downhole operation of downhole electronics (such as the solenoids).

Figure 6A:
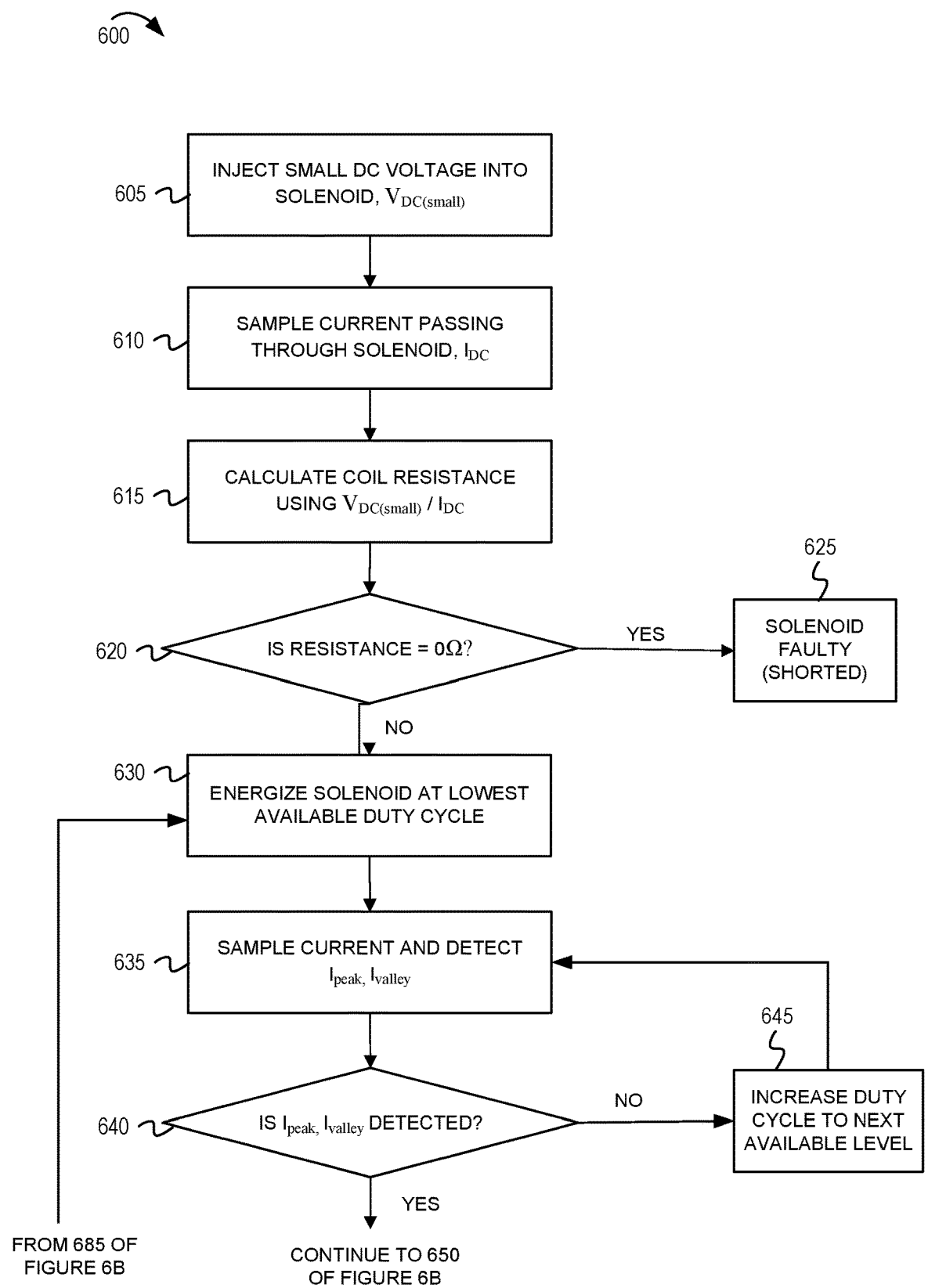
FIG. 6A is a flowchart of example operations for sampling and characterizing one or more solenoids during a characterization mode.

FIG. 6A is a flowchart 600 of example operations for sampling and characterizing one or more solenoids during a characterization mode. In some implementations, the one or more solenoids are characterized (i.e., characterization measurements are collected) during the characterization mode, prior to operating the well equipment and the corresponding one or more solenoids in the operational diagnosis mode. The operational diagnosis mode may include operating the one or more solenoids downhole (such as below ground in the well) in a downhole diagnosis mode. In the characterization mode, firstly a small signal detection technique may be used to detect the state of a solenoid (such as solenoid 151). A small DC voltage $V_{DC(small)}$ is injected into the solenoid (block 605). For example, the solenoid is energized by a low voltage signal (such as a low duty cycle of a PWM voltage signal) that is lower than the turn on voltage of the solenoid. Then, the current $I_{DC}$ passing through the solenoid is sampled (block 610). The resistance ($V_{DC(small)}/I_{DC}$) of the solenoid (i.e., the solenoid coil) is calculated (block 615). The controller may determine if the resistance of the solenoid coil is equal to zero ohms (block 620). If the resistance is approximately equal to zero ohms (0Ω), the solenoid is considered shorted or faulty (block 625). If the resistance of the solenoid coil is greater than zero ohms, then the characterization of the solenoid continues at block 630.

Figure 7A:
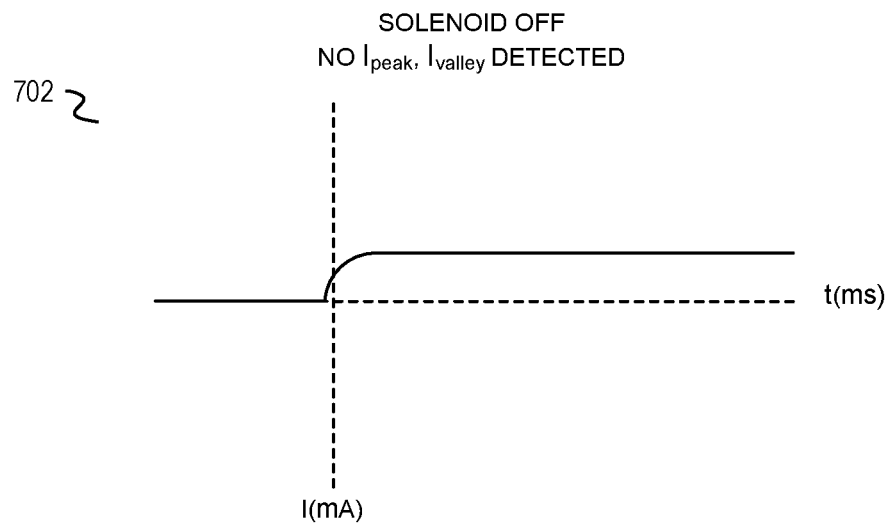
FIGS. 7A-7B are examples of current profiles including a first current profile that does not show an $I_{peak}$ and an $I_{valley}$, and a second current profile that shows an $I_{peak}$ and an $I_{valley}$.
Figure 7B:
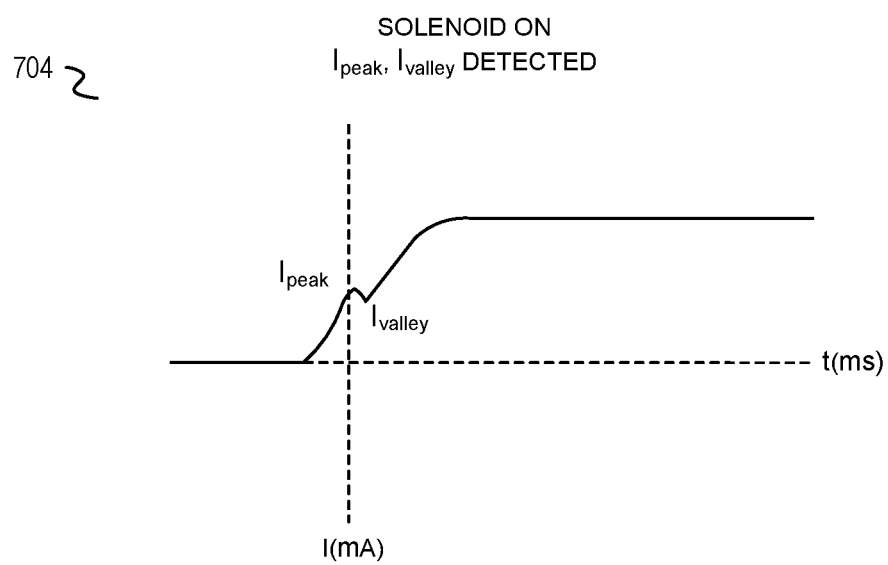

In some implementations, a sweeping energizing voltage technique (or duty cycle if energizing by PWM voltage) may be used to characterize the solenoid and to determine the turn on timing, turn on voltage, peak current, and valley current. The solenoid is first energized at the lowest available duty cycle of the PWM voltage signal (block 630) and at a minimum test temperature $T_{i=min}$. An ADC (such as the ADC 120) samples the current profile and the controller attempts to detect the peak current ($I_{peak}$) and valley current ($I_{valley}$) for that particular drive voltage (block 635). The controller determines whether the peak current and valley current are detected (block 640). The peak current and the valley current can be located by digital processing by first filtering away the noise from the current profile and using peak detection techniques to locate the two points (i.e., the peak current and valley current). FIGS. 7A and 7B show two examples of current profiles. The first current profile in 702 of FIG. 7A does not show an $I_{peak}$ and an $I_{valley}$, which indicates the solenoid is OFF or not activated. The second profile in 704 of FIG. 7B shows a first (top) peak, referred to as the $I_{peak}$, and a second (bottom) peak, referred to as the $I_{valley}$, which indicates the solenoid is ON or activated.

Returning to FIG. 6A, if no peak current and valley current are detected, it indicates the solenoid is not turned on, and the duty cycle is then increased to next available level (block 645). The process loops back to block 635 and the current sampling technique for locating the peak current and valley current is repeated at the increased duty cycle level, which corresponds to an increased drive voltage (or PWM voltage signal with the increased duty cycle). The process repeats until the controller detects a peak current and a valley current, which indicates the corresponding duty cycle turned ON or activated the solenoid. Once the peak current and valley current are located, the solenoid is said to be ON and the corresponding duty cycle is recorded. The recorded duty cycle at the minimum test temperature may be represented as $D_{on(j=min) @ Ti}$ and may be referred to as the minimum solenoid open threshold or the minimum activation voltage. The process may be performed one or more times with one or more drive voltages to determine the minimum duty cycle that corresponds to the minimum activation voltage for the solenoid. Also, the process may be repeated for multiple temperatures, as further described below. After recording the duty cycle, the process continues at block 650 in FIG. 6B.

Figure 6B:
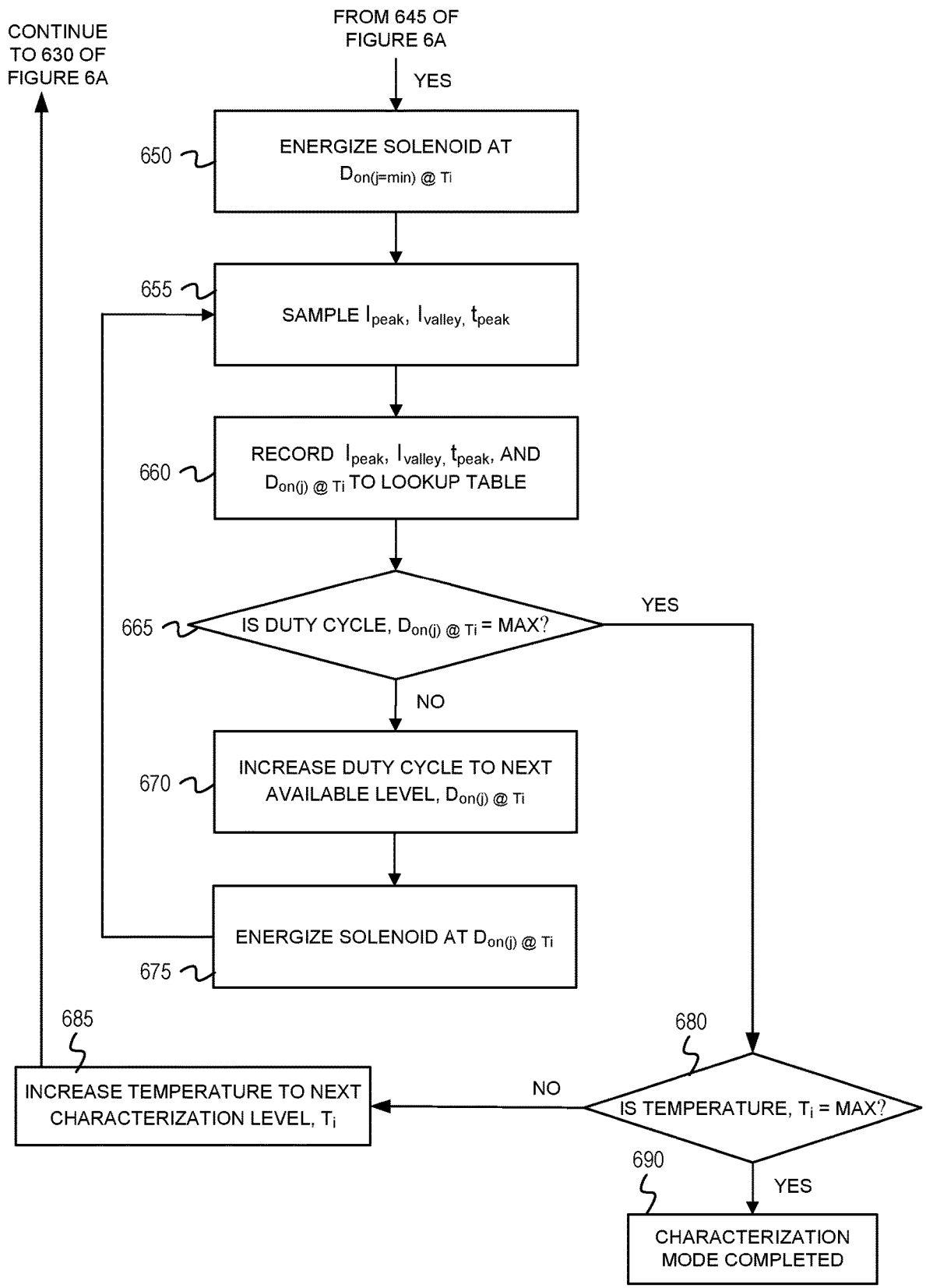
FIG. 6B is a continuation of the flowchart of FIG. 6A including example operations for sampling and characterizing one or more solenoids during a characterization mode.

In FIG. 6B, after determining the minimum activation voltage (or the minimum solenoid open threshold), the solenoid is energized at the minimum activation voltage, $D_{on(j=min)}$ and at the minimum test temperature (block 650) to sample the peak current ($I_{peak}$), the valley current ($I_{valley}$) and the peak time ($t_{peak}$) (block 655). The peak current, the valley current, and the peak time may be referred to as characterization measurements. The characterization measurements may then be recorded together with the duty cycle (corresponding to the drive voltage) and the temperature in a lookup table (block 660), such as a five dimensional (5D) lookup table. The lookup table may be stored in the memory of the processor board, such as the processor board having the controller. The controller may determine whether duty cycle used to sample the characterization measurements is the maximum available duty cycle (block 665). If the duty cycle is not the maximum duty cycle, the duty cycle may then be increased to the next available level, $D_{on(j)}$ (at the same temperature), which corresponds to an increase in the drive voltage (block 670). The solenoid is energized using the selected duty cycle (i.e., the next available duty cycle, $D_{on(j)}$) (block 675). The process is repeated for the selected duty cycle to sample and record new characterization measurements, i.e., new $I_{peak}$, $I_{valley}$ and $t_{peak}$ (block 655). The process continues to be repeated for various duty cycle until the maximum duty cycle, which corresponds to the maximum drive voltage, is used to sample the solenoid to obtain the characterization measurements.

After the maximum duty cycle is used to sample the solenoid (block 665), the controller determines whether the temperature used to obtain the previous characterization measurements was the maximum test temperature (block 680). Solenoids behave differently with temperature. When the temperature changes, the characterization measurements, such as $I_{peak}$, $I_{valley}$ and $t_{peak}$ will vary. If the temperature was not the maximum test temperature, the controller may increase the temperature to the next available temperature level or the next characterization level (block 685). After increasing the temperature, the process loops back to block 630 of FIG. 6A to repeat the sampling of the solenoid to obtain characterization measurements at the updated temperature. The process may repeat various times using various temperature levels until the controller determines the previous characterization measurements were obtained at the maximum test temperature (block 680), and then the characterization mode is completed (block 690). In some implementations, at the end of the characterization process, the lookup table may be 5D with various $I_{peak}$, $I_{valley}$ and $t_{peak}$ at various duty cycles (corresponding to various drive voltages) and various temperatures. The lookup table may be used during the operational diagnosis mode (such as a downhole diagnosis mode) to determine the status of solenoid, as further described below. For example, the controller can determine whether the solenoid is working properly or whether the solenoid is open, closed, failed, or shorted.

Figure 8A:
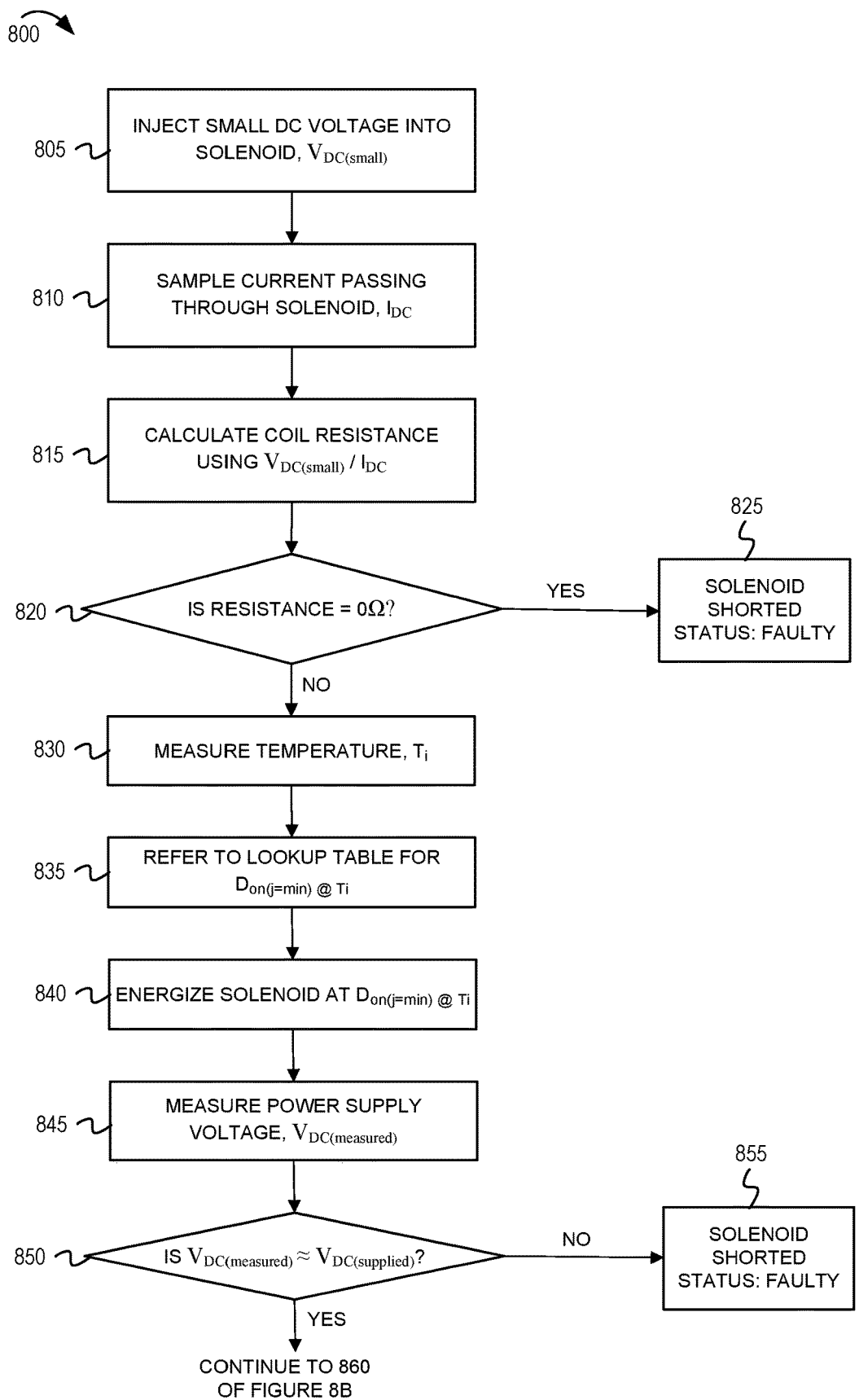
FIG. 8A is a flowchart of example operations for sampling one or more solenoids during an operational diagnosis mode and comparing the sampling measurements to the characterization measurements to diagnose the one or more solenoids.

FIG. 8A is a flowchart 800 of example operations for sampling one or more solenoids during an operational diagnosis mode and comparing the sampling measurements to the characterization measurements to diagnose the one or more solenoids. The operational diagnosis mode may include operating the one or more solenoids downhole (such as below ground in the well) in a downhole diagnosis mode. In the diagnosis mode, firstly a small signal detection technique may be used to detect the state of a solenoid (such as solenoid 151). A small DC voltage $V_{DC(small)}$ is injected into the solenoid (block 805). For example, the solenoid is energized by a low voltage signal (such as a low duty cycle of a PWM voltage signal) that is lower than the turn on voltage of the solenoid. Then, the current $I_{DC}$ passing through the solenoid is sampled (block 810). The resistance ($V_{DC(small)}/I_{DC}$) of the solenoid (i.e., the solenoid coil) is calculated (block 815). The controller may determine if the resistance of the solenoid coil is equal to zero ohms (block 820). If the resistance is approximately equal to zero ohms (0Ω), the solenoid is considered shorted or faulty (block 825). If the resistance of the solenoid coil is greater than zero ohms, then the diagnosis of the solenoid continues at block 830.

In the operational diagnosis mode, the temperature $T_i$ is measured (block 830). For example, the temperature downhole is measured during the operations diagnosis mode (or the downhole diagnosis mode). The controller references the stored lookup table from the characterization mode, and the minimum open threshold $D_{on(j=min) @ Ti}$ (which also may be referred to as the minimum activation voltage) is read from the lookup table (block 835). Next, the solenoid is energized at $D_{on(j=min) @ Ti}$ (block 840). By using the minimum duty cycle corresponding to the minimum activation voltage, less power is used to turn on or activate the solenoid, hence conserving energy. Then, the voltage $V_{measured}$ of the power supply is measured (block 845). The controller determines if the measured voltage is approximately equal to the supplied voltage $V_{supplied}$ of the power supply (block 850). For the measured voltage, if there is any variation between measured and intended or supplied voltage, it may be an indication that the solenoid is faulty. Thus, if the measured voltage is not approximately equal to the supplied voltage, the controller determines the solenoid is shorted and the status of the solenoid is flagged as faulty or bad (block 855). If the measured voltage is approximately equal to the supplied voltage, the process continues at block 860 of FIG. 8B.

Figure 8B:
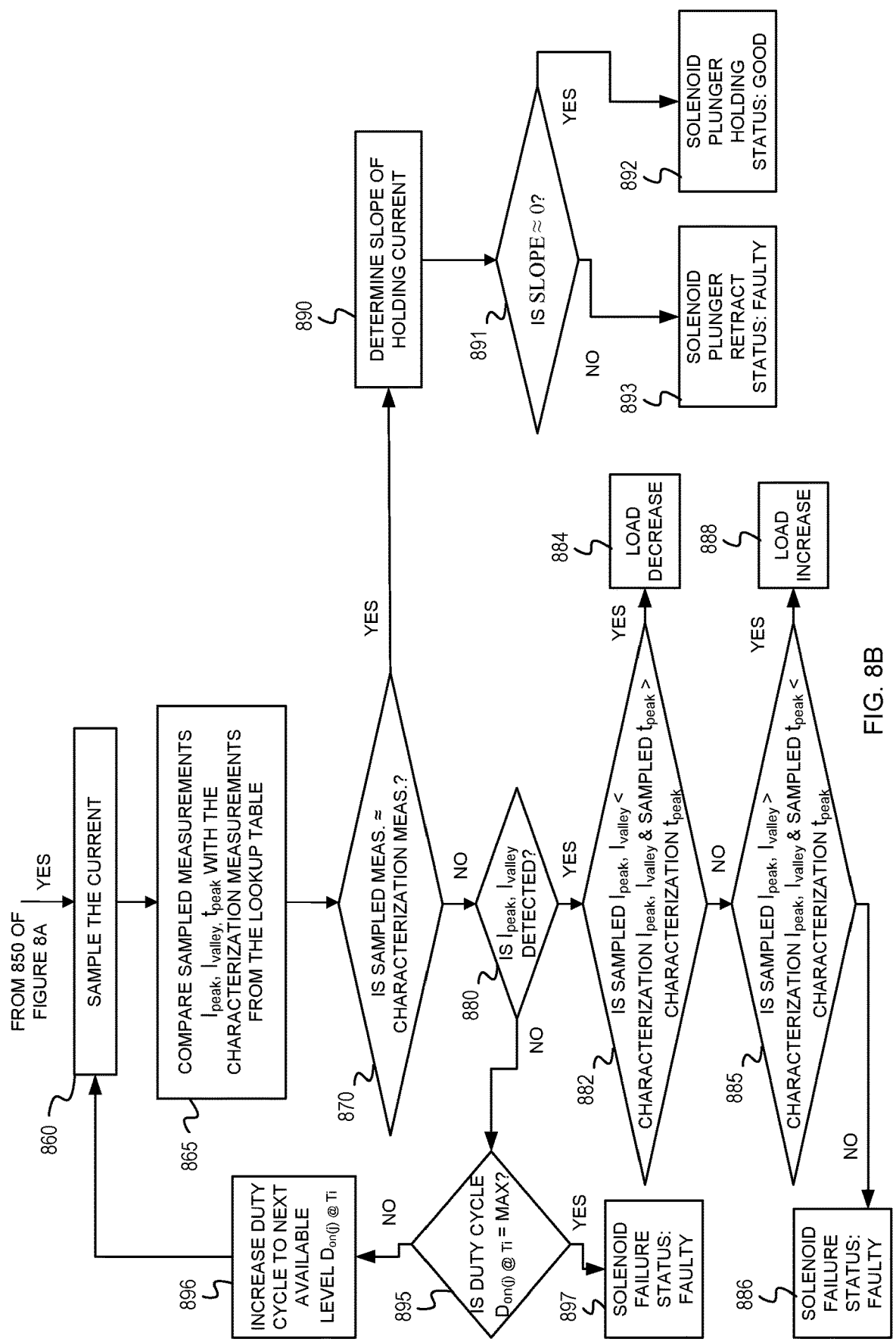
FIG. 8B is a continuation of the flowchart of FIG. 8A including example operations for sampling one or more solenoids during an operational diagnosis mode and comparing the sampling measurements to the characterization measurements to diagnose the one or more solenoids.

In FIG. 8B, the ADC samples the current profile of the solenoid (block 860) and the controller compares the sampled measurements, such as the sampled $I_{peak}$, $I_{valley}$ and $t_{peak}$, are compared with the characterization measurements, such as the characterization $I_{peak}$, $I_{valley}$ and $t_{peak}$ from the lookup table (block 865). For example, the controller determines if the sampled measurements are approximately equal to the characterization measurements (block 870). If the sampled and characterization measurements are not approximately equal, further checks are performed to determine whether a sampled $I_{peak}$, $I_{valley}$ are detected (block 880). The solenoid is determined to be potentially stuck if the sampled current profile does not show the $I_{peak}$, $I_{valley}$ (block 880) and the controller determines if the duty cycle is the maximum duty cycle (block 895). In this case, if the duty cycle is not the maximum duty cycle, the duty cycle is increased to the next available level (block 896), which corresponds to an increase in the drive voltage. Increasing the duty cycle, which corresponds to an increase in the drive voltage, provides more energy to the solenoid in an attempt to self-recover. Otherwise, if the duty cycle is at the maximum duty cycle (block 897), the solenoid is flagged as faulty. If the sampled $I_{peak}$, $I_{valley}$ are detected (block 880), the solenoid is determined to be in the ON or activated state, and the operational diagnosis mode continues.

The controller determines if the sampled $I_{peak}$, $I_{valley}$ are less than the characterization $I_{peak}$, $I_{valley}$, and if the sampled $t_{peak}$ is greater than the characterization $t_{peak}$ (block 882). If the sampled $I_{peak}$, $I_{valley}$ are less than the characterization $I_{peak}$, $I_{valley}$, and if the sampled $t_{peak}$ is greater than the characterization $t_{peak}$, this indicates that there has been a change in the load in the system, and in this case it indicates a decrease of the load of the system (block 884). If either the sampled $I_{peak}$, $I_{valley}$ are not less than the characterization $I_{peak}$, $I_{valley}$, or if the sampled $t_{peak}$ is not greater than the characterization $t_{peak}$, the operational diagnosis mode continues. The controller determines if the sampled $I_{peak}$, $I_{valley}$ are greater than the characterization $I_{peak}$, $I_{valley}$, and if the sampled $t_{peak}$ is less than the characterization $t_{peak}$ (block 885). If the sampled $I_{peak}$, $I_{valley}$ are greater than the characterization $I_{peak}$, $I_{valley}$, and if the sampled $t_{peak}$ is less than the characterization $t_{peak}$, this indicates that there has been a change in the load in the system, and in this case it indicates an increase in the load of the system (block 888). If either the sampled $I_{peak}$, $I_{valley}$ are not greater than the characterization $I_{peak}$, $I_{valley}$, or if the sampled $t_{peak}$ is not less than the characterization $t_{peak}$, the solenoid is flagged as faulty (block 886).

As described above, the possible scenarios to explain why the sampled measurements differ from the characterization measurements could be due to a load change in the system. Prior to downhole usage in the operational or downhole diagnosis mode, the solenoids are characterized on a known system, which is the normal operating load condition. During downhole operation, the change of load, i.e., pressure change, can vary the $I_{peak}$, $I_{valley}$, and $t_{peak}$. A higher load, i.e., higher pressure, may require higher open and holding current, hence higher $I_{peak}$, $I_{valley}$ and shorter $t_{peak}$ compared to the characterization measurements. Likewise, a lower load, i.e., lower pressure, may result in lower $I_{peak}$, $I_{valley}$ and longer $t_{peak}$. Therefore, the operational or downhole mode diagnosis described above may not only serve the purpose of determining the status of the solenoid, but also detecting unusual and unexpected load change in the system. This may allow field engineers to make an informed decision on whether the load change will cause unexpected system behavior and thus safety issues.

If the controller determines the sampled measurements are approximately equal to the characterization measurements (block 870), the slope of the holding current is determined to further confirm the solenoid is turned ON and holding (block 890). The controller determines if the slope is approximately equal to zero (block 891). If the slope is approximately zero, the solenoid plunger is holding in its ON state and hence the solenoid is functioning normally (block 892). If the slope is not approximately zero, the solenoid plunger is not holding in its ON state and hence the solenoid is determined to be faulty (block 893). At any point of time, if the slope increases or decrease and the solenoid is not intended to turn OFF, the solenoid is considered to be retracted (OFF state) and is flagged it as faulty or bad.

Figure 9:
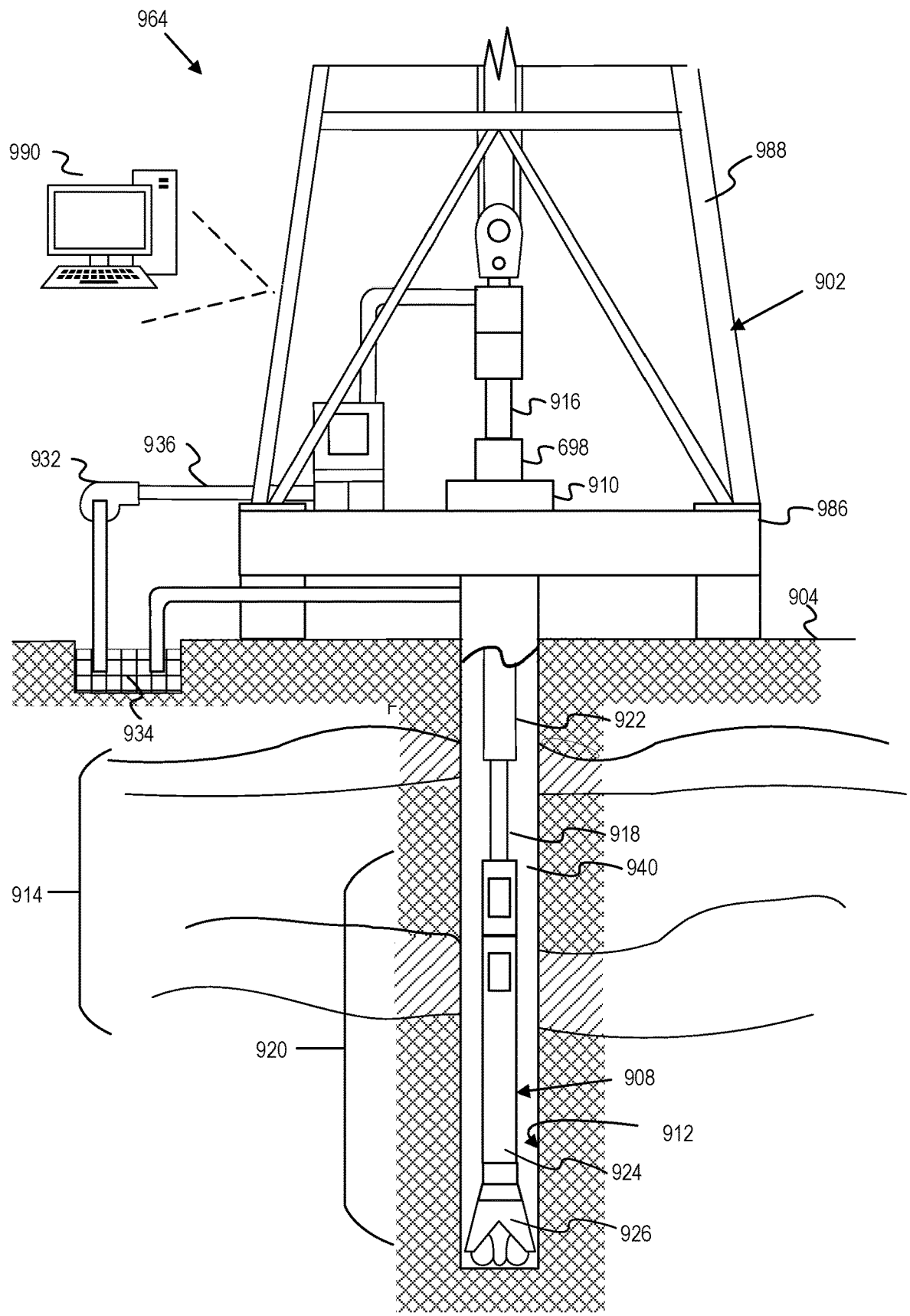
FIG. 9 is an example schematic diagram of a drilling rig system which includes surface and downhole equipment having one or more solenoids.

FIG. 9 is a schematic diagram of a drilling rig system, as an example of oil services systems that use surface and downhole equipment. For example, in FIG. 9 it can be seen how a system 964 may also form a portion of a drilling rig 902 located at the surface 904 of a well. Drilling of oil and gas wells is commonly carried out using a string of drill pipes connected together so as to form a drilling string 908 that may be lowered through a rotary table 910 into a wellbore or borehole 912. Here a drilling platform 986 may be equipped with a derrick 988 that supports a hoist. A computer system 990 may be communicatively coupled to the surface and downhole equipment including the apparatus and system 100 shown in FIG. 1 having one or more solenoids in order to characterize and diagnose the one or more solenoids, as described herein. For example, the computer system 990 may include memory (machine or computer readable media) and one or more processors or one or more controllers that perform the solenoid characterization and solenoid diagnosis processes described herein.

The drilling rig 902 may thus provide support for the drill string 908. The drill string 908 may operate to penetrate the rotary table 910 for drilling the borehole 912 through subsurface formations 914. The drill string 908 may include a Kelly 916, drill pipe 918, and a bottom hole assembly 920, perhaps located at the lower portion of the drill pipe 918.

The bottom hole assembly 920 may include drill collars 922, a downhole equipment or tool 924, and a drill bit 926. The drill bit 926 may operate to create a borehole 912 by penetrating the surface 904 and subsurface formations 914. The downhole equipment or tool 924 may comprise any of a number of different types of tools including MWD tools, LWD tools, and others.

During drilling operations, the drill string 908 (perhaps including the Kelly 916, the drill pipe 918, and the bottom hole assembly 920) may be rotated by the rotary table 910. In addition to, or alternatively, the bottom hole assembly 920 may also be rotated by a motor (e.g., a mud motor) that may be located downhole. The drill collars 922 may be used to add weight to the drill bit 926. The drill collars 922 may also operate to stiffen the bottom hole assembly 920, allowing the bottom hole assembly 920 to transfer the added weight to the drill bit 926, and in turn, to assist the drill bit 926 in penetrating the surface 904 and subsurface formations 914.

Drilling operations may utilize various surface equipment, such as a mud pump 932 or other types of surface or downhole equipment. The surface or downhole equipment may one or more solenoids, as described herein. During drilling operations, the mud pump 932 may pump drilling fluid (sometimes known by those of ordinary skill in the art as "drilling mud") from a mud pit 934 through a hose 936 into the drill pipe 918 and down to the drill bit 926. The drilling fluid may flow out from the drill bit 926 and be returned to the surface 904 through an annular area 940 between the drill pipe 918 and the sides of the borehole 912. The drilling fluid may then be returned to the mud pit 934, where such fluid may be filtered. In some embodiments, the drilling fluid may be used to cool the drill bit 926, as well as to provide lubrication for the drill bit 926 during drilling operations. Additionally, the drilling fluid may be used to remove subsurface formation 914 cuttings created by operating the drill bit 926. It may be the images of these cuttings that many implementations operate to acquire and process.

While the aspects of the disclosure are described with reference to various implementations and exploitations, it will be understood that these aspects are illustrative and that the scope of the claims is not limited to them. In general, techniques for reservoir modeling as described herein may be implemented with facilities consistent with any hardware system or hardware systems. Many variations, modifications, additions, and improvements are possible.

Plural instances may be provided for components, operations or structures described herein as a single instance. Finally, boundaries between various components, operations, and data stores are somewhat arbitrary, and particular operations are illustrated in the context of specific illustrative configurations. Other allocations of functionality are envisioned and may fall within the scope of the disclosure. In general, structures and functionality presented as separate components in the example configurations may be implemented as a combined structure or component. Similarly, structures and functionality presented as a single component may be implemented as separate components. These and other variations, modifications, additions, and improvements may fall within the scope of the disclosure.

As used herein, the term "or" is inclusive unless otherwise explicitly noted. Thus, the phrase "at least one of A, B, or C" is satisfied by any element from the set {A, B, C} or any combination thereof, including multiples of any element.

Example Embodiments

Example embodiments can include the following:

Embodiment #1: A method for diagnosing an operational state of one or more solenoids used in well equipment, including: determining characterization measurements for a solenoid, the characterization measurements obtained during a characterization mode of the solenoid based on a plurality of drive voltages and a plurality of temperatures; determining sampled measurements for the solenoid during an operational diagnosis mode of the well equipment; and comparing the characterization measurements to the sampled measurements to diagnose an operational state of the solenoid.

Embodiment #2: The method of Embodiment #1, wherein, for each of the plurality of temperatures, the characterization measurements include at least one or more of minimum activation voltage of the solenoid; peak current and valley current of the solenoid at each of the plurality of drive voltages; and peak time associated with the peak current of the solenoid at each of the plurality of drive voltages.

Embodiment #3: The method of Embodiment #1, wherein determining characterization measurements of the solenoid includes: determining a minimum activation voltage that activates the solenoid by providing one or more drive voltages of the plurality of drive voltages to the solenoid during the characterization mode for each of the plurality of temperatures.

Embodiment #4: The method of Embodiment #1, wherein determining characterization measurements of the solenoid includes: determining a peak current, a valley current, and a peak time for each of the plurality of drive voltages by providing the plurality of drive voltages to the solenoid during the characterization mode for each of the plurality of temperatures.

Embodiment #5: The method of Embodiment #1, further comprising: storing the characterization measurements obtained from the plurality of drive voltages and the plurality of temperatures in a lookup table, wherein determining characterization measurements of the solenoid includes reading the characterization measurements from the lookup table.

Embodiment #6: The method of Embodiment #1, further comprising: prior to determining characterization measurements of the solenoid, providing a driving voltage to the solenoid that does not activate the solenoid during the characterization mode; sampling a current at the solenoid; and determining the solenoid is faulty if a calculated resistance at the solenoid is approximately equal to zero.

Embodiment #7: The method of Embodiment #1, further comprising: measuring a temperature at the solenoid during the operational diagnosis mode of the well equipment; determining a minimum activation voltage that activates the solenoid from the characterization measurements associated with the measured temperature; providing the minimum activation voltage to the solenoid to activate the solenoid; and determining the solenoid is faulty if a sampled voltage at the solenoid is not approximately equal to a supplied voltage.

Embodiment #8: The method of Embodiment #1, wherein determining the sampled measurements for the solenoid during the operational diagnosis mode of the well equipment include: measuring a temperature at the solenoid during the operational diagnosis mode of the well equipment; and sampling a peak current, a valley current, and a peak time for a minimum activation voltage by providing the minimum activation voltage to the solenoid during the operational diagnosis mode of the well equipment.

Embodiment #9: The method of Embodiment #8, wherein comparing the characterization measurements to the sampled measurements to diagnose the operational state of the solenoid include: determining, from the characterization measurements, a characterization peak current, a characterization valley current, a characterization peak time for the minimum activation voltage and the measured temperature; and comparing the sampling peak current, the sampled valley current, and the sampled peak time to the characterization peak current, the characterization valley current, and the characterization peak time to diagnose the operational state of the solenoid.

Embodiment #10: The method of Embodiment #9, further comprising: if the characterization measurements are approximately equal to the sampled measurements, determining the operational state of the solenoid based on a slope of a holding current at the solenoid.

Embodiment #11: The method of Embodiment #10, further comprising: if the holding current is approximately equal to zero, determining the solenoid is functioning properly; and if the holding current is not approximately equal to zero, determining the solenoid is faulty.

Embodiment #12: The method of Embodiment #9, further comprising: if the characterization measurements are not approximately equal to the sampled measurements, determining the solenoid is faulty if the sampled peak current and the sampled valley current are not detected and a drive voltage is at a maximum available drive voltage, or determining to increase the drive voltage to a next available level if the sampled peak current and the sampled valley current are not detected and the drive voltage is not at the maximum available drive voltage.

Embodiment #13: The method of Embodiment #9, further comprising: if the characterization measurements are not approximately equal to the sampled measurements, determining a load associated with the well equipment has decreased if the sampled peak current is less than the characterization peak current, the sampled valley current is less than the characterization valley current, and the sampled peak time is greater than the characterization peak time, and determining the load associated with the well equipment has increased if the sampled peak current is greater than the characterization peak current, the sampled valley current is greater than the characterization valley current, and the sampled peak time is less than the characterization peak time.

Embodiment #14: The method of Embodiment #9, further comprising: if the characterization measurements are not approximately equal to the sampled measurements, determining the solenoid is faulty if the sampled peak current is less than the characterization peak current, the sampled valley current is less than the characterization valley current, and the sampled peak time is less than the characterization peak time, and determining the solenoid is faulty if the sampled peak current is greater than the characterization peak current, the sampled valley current is greater than the characterization valley current, and the sampled peak time is greater than the characterization peak time.

Embodiment #15: The method of Embodiment #9, further comprising: performing the characterization and diagnosis of one or more additional solenoids of the well equipment to diagnose the operational state of the one or more additional solenoids.

Embodiment #16: The method of Embodiment #9, further comprising performing synchronized sampling for the solenoid using an analog-to-digital converter (ADC) clock signal and a pulse width modulator (PWM) signal by performing at least one of: adding a delay between the PWM signal and the ADC clock signal to avoid sampling at or near an edge of the PWM signal; and using a higher frequency ADC clock signal compared to a frequency of the PWM signal for the sampling.

Embodiment #17: A characterization and diagnosis system for determining an operational state of one or more solenoids of well equipment, including: one or more processors; and a characterization and diagnosis apparatus coupled with the one or more processors and configured to: determine characterization measurements for a solenoid, the characterization measurements obtained during a characterization mode of the solenoid based on a plurality of drive voltages and a plurality of temperatures; determine sampled measurements for the solenoid during an operational diagnosis mode of the well equipment; and comparing the characterization measurements to the sampled measurements to diagnose an operational state of the solenoid.

Embodiment #18: The characterization and diagnosis system of Embodiment #17, wherein the characterization and diagnosis apparatus configured to determine the sampled measurements for the solenoid during the operational diagnosis mode includes the characterization and diagnosis apparatus configured to: measure a temperature at the solenoid during the operational diagnosis mode of the well equipment; and sample a peak current, a valley current, and a peak time for a minimum activation voltage by providing the minimum activation voltage to the solenoid during the operational diagnosis mode of the well equipment.

Embodiment #19: The characterization and diagnosis system of Embodiment #18, wherein the characterization and diagnosis apparatus configured to compare the characterization measurements to the sampled measurements to diagnose the operational state of the solenoid includes the characterization and diagnosis apparatus configured to: determine, from the characterization measurements, a characterization peak current, a characterization valley current, a characterization peak time for the minimum activation voltage and the measured temperature; and compare the sampling peak current, the sampled valley current, and the sampled peak time to the characterization peak current, the characterization valley current, and the characterization peak time to diagnose the operational state of the solenoid.

Embodiment #20: An apparatus for characterizing and diagnosing an operational state of one or more solenoids of well equipment, including: one or more processors; and a computer-readable medium having instructions stored thereon that are executable by the one or more processors, the instructions including: instructions for determining sampled measurements for a solenoid during an operational diagnosis mode of the well equipment; instructions for determining sampled measurements for the solenoid during an operational diagnosis mode of the well equipment; and instructions for comparing the characterization measurements to the sampled measurements to diagnose an operational state of the solenoid.

What is claimed is:

1. A method for diagnosing an operational state of one or more solenoids used in well equipment, comprising:
    determining characterization measurements for a solenoid, the characterization measurements obtained during a characterization mode of the solenoid based on a plurality of drive voltages and a plurality of temperatures;
    performing sensorless synchronized sampling to determine sampled measurements for the solenoid during an operational diagnosis mode of the well equipment; and
    comparing the characterization measurements to the sampled measurements to diagnose the operational state of the solenoid.

2. The method of claim 1, wherein, for each of the plurality of temperatures, the characterization measurements include at least one or more of:
    minimum activation voltage of the solenoid;
    peak current and valley current of the solenoid at each of the plurality of drive voltages; and
    peak time associated with the peak current of the solenoid at each of the plurality of drive voltages.

3. The method of claim 1, wherein determining the characterization measurements of the solenoid includes:
    determining a minimum activation voltage that activates the solenoid by providing one or more drive voltages of the plurality of drive voltages to the solenoid during the characterization mode for each of the plurality of temperatures.

4. The method of claim 1, wherein determining the characterization measurements of the solenoid includes:
    determining a peak current, a valley current, and a peak time for each of the plurality of drive voltages by providing the plurality of drive voltages to the solenoid during the characterization mode for each of the plurality of temperatures.

5. The method of claim 1, further comprising:
    storing the characterization measurements obtained from the plurality of drive voltages and the plurality of temperatures in a lookup table,
    wherein determining the characterization measurements of the solenoid includes reading the characterization measurements from the lookup table.

6. The method of claim 1, further comprising:
    prior to determining the characterization measurements of the solenoid,
        providing a driving voltage to the solenoid that does not activate the solenoid during the characterization mode;
        sampling a current at the solenoid; and
        determining the solenoid is faulty if a calculated resistance at the solenoid is approximately equal to zero.

7. The method of claim 1, further comprising:
    measuring a temperature at the solenoid during the operational diagnosis mode of the well equipment;
    determining a minimum activation voltage that activates the solenoid from the characterization measurements associated with the measured temperature;
    providing the minimum activation voltage to the solenoid to activate the solenoid; and
    determining the solenoid is faulty if a sampled voltage at the solenoid is not approximately equal to a supplied voltage.

8. The method of claim 1, wherein performing the sensorless synchronized sampling to determine the sampled measurements for the solenoid during the operational diagnosis mode of the well equipment includes:
    measuring a temperature at the solenoid during the operational diagnosis mode of the well equipment; and
    sampling a peak current, a valley current, and a peak time for a minimum activation voltage by providing the minimum activation voltage to the solenoid during the operational diagnosis mode of the well equipment.

9. The method of claim 8, wherein comparing the characterization measurements to the sampled measurements to diagnose the operational state of the solenoid includes:
    determining, from the characterization measurements, a characterization peak current, a characterization valley current, a characterization peak time for the minimum activation voltage and the measured temperature; and comparing the sampled peak current, the sampled valley current, and the sampled peak time to the characterization peak current, the characterization valley current, and the characterization peak time to diagnose the operational state of the solenoid.

10. The method of claim 1, further comprising:
if the characterization measurements are approximately equal to the sampled measurements, determining the operational state of the solenoid based on a slope of a holding current at the solenoid.

11. The method of claim 10, further comprising:
if the holding current is approximately equal to zero, determining the solenoid is functioning properly; and
if the holding current is not approximately equal to zero, determining the solenoid is faulty.

12. The method of claim 9, further comprising:
if the characterization measurements are not approximately equal to the sampled measurements,
determining the solenoid is faulty if the sampled peak current and the sampled valley current are not detected and a drive voltage is at a maximum available drive voltage, or
determining to increase the drive voltage to a next available level if the sampled peak current and the sampled valley current are not detected and the drive voltage is not at the maximum available drive voltage.

13. The method of claim 9, further comprising:
if the characterization measurements are not approximately equal to the sampled measurements,
determining a load associated with the well equipment has decreased if the sampled peak current is less than the characterization peak current, the sampled valley current is less than the characterization valley current, and the sampled peak time is greater than the characterization peak time, and
determining the load associated with the well equipment has increased if the sampled peak current is greater than the characterization peak current, the sampled valley current is greater than the characterization valley current, and the sampled peak time is less than the characterization peak time.

14. The method of claim 9, further comprising:
if the characterization measurements are not approximately equal to the sampled measurements,
determining the solenoid is faulty if the sampled peak current is less than the characterization peak current, the sampled valley current is less than the characterization valley current, and the sampled peak time is less than the characterization peak time, and
determining the solenoid is faulty if the sampled peak current is greater than the characterization peak current, the sampled valley current is greater than the characterization valley current, and the sampled peak time is greater than the characterization peak time.

15. The method of claim 1, further comprising:
performing characterization and diagnosis of one or more additional solenoids of the well equipment to diagnose the operational state of the one or more additional solenoids.

16. The method of claim 1, wherein performing the sensorless synchronized sampling for the solenoid includes performing synchronized sampling using an analog-to-digital converter (ADC) clock signal and a pulse width modulator (PWM) signal by performing at least one of:

adding a delay between the PWM signal and the ADC clock signal to avoid sampling at or near an edge of the PWM signal; and
using a higher frequency ADC clock signal compared to a frequency of the PWM signal for the sampling.

17. A characterization and diagnosis system for determining an operational state of one or more solenoids of well equipment, comprising:
one or more processors; and
a characterization and diagnosis apparatus coupled with the one or more processors and configured to:
determine characterization measurements for a solenoid, the characterization measurements obtained during a characterization mode of the solenoid based on a plurality of drive voltages and a plurality of temperatures;
perform sensorless synchronized sampling to determine sampled measurements for the solenoid during an operational diagnosis mode of the well equipment; and
compare the characterization measurements to the sampled measurements to diagnose the operational state of the solenoid.

18. The characterization and diagnosis system of claim 17, wherein the characterization and diagnosis apparatus configured to perform the sensorless synchronized sampling to determine the sampled measurements for the solenoid during the operational diagnosis mode includes the characterization and diagnosis apparatus configured to:
measure a temperature at the solenoid during the operational diagnosis mode of the well equipment; and
sample a peak current, a valley current, and a peak time for a minimum activation voltage by providing the minimum activation voltage to the solenoid during the operational diagnosis mode of the well equipment.

19. The characterization and diagnosis system of claim 18, wherein the characterization and diagnosis apparatus configured to compare the characterization measurements to the sampled measurements to diagnose the operational state of the solenoid includes the characterization and diagnosis apparatus configured to:
determine, from the characterization measurements, a characterization peak current, a characterization valley current, a characterization peak time for the minimum activation voltage and the measured temperature; and
compare the sampling peak current, the sampled valley current, and the sampled peak time to the characterization peak current, the characterization valley current, and the characterization peak time to diagnose the operational state of the solenoid.

20. An apparatus for characterizing and diagnosing an operational state of one or more solenoids of well equipment, comprising:
one or more processors; and
a computer-readable medium having instructions stored thereon that are executable by the one or more processors, the instructions including:
instructions for determining characterization measurements for a solenoid, the characterization measurements obtained during a characterization mode of the solenoid based on a plurality of drive voltages and a plurality of temperatures;
instructions for performing sensorless synchronized sampling to determine sampled measurements for the solenoid during an operational diagnosis mode of the well equipment; and instructions for comparing the characterization measurements to the sampled measurements to diagnose the operational state of the solenoid.

\* \* \* \* \*